United States Patent

[11] 3,567,972

[72] Inventor Werner Faust
Wettingen, Switzerland

[21] Appl. No. 760,483
[22] Filed Sept. 18, 1968
[45] Patented Mar. 2, 1971
[73] Assignee Aktiengesellschaft Brown Boveri & Cie
Baden, Switzerland
[32] Priority Sept. 20, 1967
[33] Switzerland
[31] 13157/67

[54] ARRANGEMENT FOR IGNITING SERIES CONNECTED POWER THYRISTORS BY MEANS OF AUXILIARY THYRISTOR CIRCUIT CONTROLLED BY LIGHT-SENSITIVE ELEMENTS
6 Claims, 5 Drawing Figs.

[52] U.S. Cl. .......... 307/311, 307/252, 317/235
[51] Int. Cl. .......... H01l 9/12, H01l 15/00
[50] Field of Search .......... 307/311, 252 (D), 252; 317/235/41.1, 235 (Official)

[56] References Cited

UNITED STATES PATENTS

| | | | |
|---|---|---|---|
| 3,459,943 | 8/1969 | Harnden, Jr. .......... | 250/208 |
| 3,355,600 | 11/1967 | Mapham .......... | 307/88.5 |
| 3,317,752 | 5/1967 | Zuk .......... | 307/88.5 |
| 3,283,171 | 11/1966 | Seeds .......... | 307/88.5 |

*Primary Examiner*—John W. Huckert
*Assistant Examiner*—Martin H. Edlow
*Attorney*—Pierce, Scheffler and Parker

ABSTRACT: An arrangement for igniting each of a plurality of series connected power thyristors of a high voltage operating circuit comprises a plurality of auxiliary thyristors arranged in series and connected between the anode side of the power thyristor and its control electrode. The auxiliary thyristors require relatively small operating current for their ignition and the necessary ignition current is supplied by light-sensitive control elements connected to the control electrodes of the auxiliary transistors. The light-sensitive control elements can be of any suitable type such as photodiodes, phototransistors and photoresistors.

PATENTED MAR 2 1971 3,567,972

INVENTOR.
Werner Faust
BY
Pierce, Scheffler & Parker
Attorneys

ARRANGEMENT FOR IGNITING SERIES CONNECTED POWER THYRISTORS BY MEANS OF AUXILIARY THYRISTOR CIRCUIT CONTROLLED BY LIGHT-SENSITIVE ELEMENTS

This invention relates to a light-controlled load i.e. power thyristor arrangement which operates with the assistance of auxiliary light-sensitive control elements such as semiconductors and photoresistors, and auxiliary thyristors controlled by these light-sensitive control elements.

Light control of thyristors has a particular significance when a plurality of power thyristors are connected in a series circuit and it is desired to ignite all of the thyristors at the same time.

It is customary to connect a plurality of controlled rectifiers such as power thyristors in series when the rectifiers are applied to a high voltage circuit so that the total operating voltage is then distributed among the rectifiers. The desired simultaneous ignition of the power thyristors is obtainable in a better manner with the use of light control than can be obtained with other methods of control such as for example inductive couplings.

In order to produce a light-control type of operation, light-sensitive control elements such as diodes, resistances or thyristors are utilized. See for example the SCR Manual, 3rd Edition, Page 211, the connection being made to the control electrode of the power thyristor. However, these relatively simple circuits are not suitable for use with higher voltages. The light-controlled elements are less voltage resistant against higher voltages, than the thyristors.

In accordance with the invention it is therefore proposed that the light-sensitive control element and the control electrode of an auxiliary thyristor be so connected that several auxiliary thyristors lie electrically in series, and that the auxiliary thyristors are interconnected with the control electrode of the power thyristor.

By means of the series connection of the auxiliary thyristors the voltage strength will be high. The accompanying drawings illustrate various examples of the invention wherein.

Figure 1:
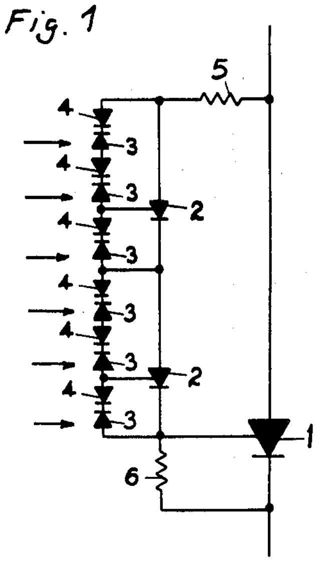
FIG. 1 illustrates one embodiment of the invention wherein light-sensitive diodes are utilized in the control circuit.

With reference now to FIG. 1, one of a plurality of series connected power thyristors is indicated in the circuit by numeral 1, and it is controlled by means of two auxiliary thyristors 2 which are connected in series and to the control electrode of the load thyristor. These auxiliary thyristors 2 are, in turn, controlled by means of a plurality of light-sensitive control elements having a low power requirement. In the particular example illustrated in FIG. 1, these light-sensitive control elements are constituted by light-sensitive diodes 3. The light sensitivity is indicated by the arrows. Connected in series opposition with each light-sensitive diode 3 is a diode 4 insensitive to light thus to form a diode pair which is arranged in series with other diode pairs across the anode, cathode and control electrodes of the auxiliary thyristor 2 through the action of light the entire diode string becomes conductive. As soon as through the action of light the entire diode string becomes conductive, a control signal will be given to the auxiliary thyristors 2. These will then conduct and give a signal to the control electrode of the power thyristor 1. The auxiliary thyristor circuit is, by way of the resistances 5 and 6 connected in the anode-cathode circuit of the power thyristor. The diodes are so arranged as to have a sweep, e.g. sawtooth voltage in both directions, i.e. a controlled avalanche diode. In this manner, higher voltages will be drawn off in spite of the opposing series circuit connection of the diodes.

Hereby occurs the advantage that this improved arrangement avoids the necessity of providing resistors in cooperation with condensers serving as energy storing devices, the thyristors being ignited by voltage pulses from the condensers as was common in prior known power thyristor igniting systems. Through the carrier damming effect any arising overvoltage will itself be prevented by means of the diode circuit.

Figure 2:
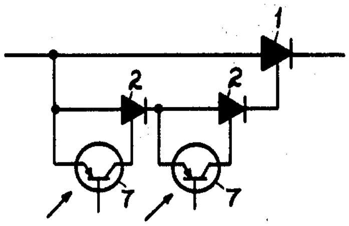
FIG. 2 shows another embodiment wherein light-sensitive transistors are utilized in the control circuit.

Another example of the invention is shown in the partial circuit diagram of FIG. 2. In this embodiment, transistors 7 are provided to serve as the light-sensitive semiconductor elements. These transistors 7 will become conductive when exposed to a light ray, as indicated by the arrows and give a firing, or ignition impulse to the control electrodes of the auxiliary thyristors 2. These latter, in turn, give a firing impulse to the control electrode of the load thyristor in the same manner as described with respect to the circuit of FIG. 1.

Figure 3:
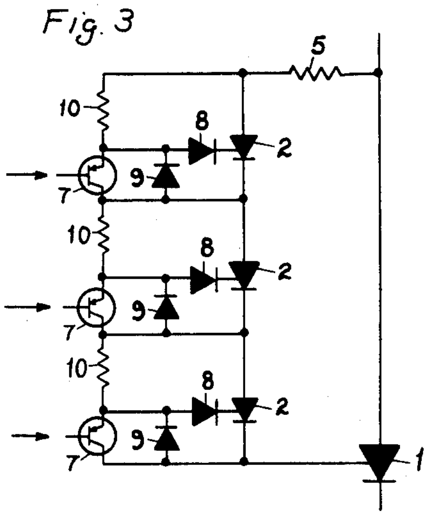
FIG. 3 illustrates another embodiment of the invention utilizing light-sensitive transistors.

FIG. 3 illustrates another embodiment utilizing series connected light-sensitive transistors 7 with additional diodes 8 and 9 connected between the transistors and the auxiliary thyristors 2, and with auxiliary resistors 10 connected in circuit between the series connected transistors 7. Each phototransistor 7 has its collector-emitter circuit serially connected through a resistor 10 and shunted by a diode 9, the anode side of the diode 9 being connected to the collector and to the cathode side of the auxiliary thyristor 2, and the cathode side of diode 9 being connected to the emitter and to the anode side of a further diode 8 whose cathode is connected to the control electrode of the auxiliary thyristor. The auxiliary thyristors require only very small control currents, i.e. of the order of from 0.1 to 1.0 mA. FIG. 3 shows a "dark" control i.e. a control wherein ignition of the power thyristor occurs upon an interruption of the light falling upon the light-sensitive elements. When the light falling on the light-sensitive transistors 7 is interrupted, small controls voltages are available to the auxiliary thyristors 2. The ohmic values of the interposed resistances 10 are so laid out that the current flowing through them remains lower than the ignition current of the power thyristors 1. The firing of the power thyristors follows as a result of interruption of the light falling upon the transistors 7. It is an inherent characteristic of light-sensitive transistors that their "dark," i.e. nonilluminated, resistance is relatively high. Conversely, when illuminated their resistance becomes relatively small. Consequently, when the light falling upon the transistors 7 is interrupted, their resistance increases to a relatively high value and produce a regulation for ignition of the auxiliary thyristors 2 with adequate control voltage. The current flowing through the thyristors 2 leads to ignition of the power thyristors 1. The diode 8 is provided to increase the voltage drop in the control circuit. Diodes 9 conduct the reverse current to the auxiliary thyristors 2. For potential control, further controlled avalanche-diodes, not illustrated, can be connected in parallel with the auxiliary thyristors.

Figure 4:
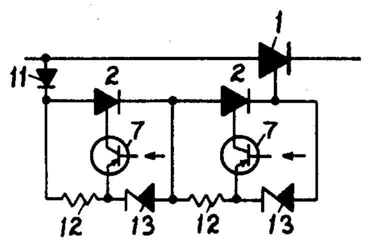
FIG. 4 illustrates still another embodiment wherein phototransistors are utilized in the control circuit.

FIG. 4 illustrates another embodiment wherein the collector-emitter circuit of each phototransistor 7 lies directly in the circuit of the control electrode of the associated auxiliary thyristor 2. The collector is connected to the control electrode of the auxiliary thyristor 2 and the emitter is connected in between a resistor 12 and Zener diode 13 that are arranged in a series circuit extending between the anode and cathode sides of the thyristor 2. As with the other embodiments the thyristors 2 are connected in series with one end of the string of auxiliary thyristors 2 connected to the control electrode of the power transistor 1 and the other end connected through a diode 11 to the anode side of the power transistor. instead of transistors 7, one can also use light-sensitive thyristors in this embodiment.

Figure 5:
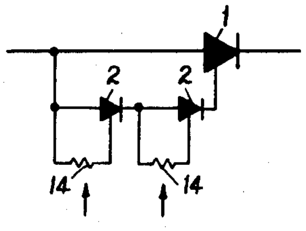
FIG. 5 illustrates a further embodiment utilizing light-sensitive resistances in the control circuit.

FIG. 5 illustrates another embodiment which shows a control circuit that employs light-sensitive resistors 14 connected to the control electrodes of the auxiliary transistors 2, the resistance value of these resistors being relatively low when exposed to light and relatively high when no light falls upon them. The light action so changes the resistance value that the change in control current through them becomes sufficient for ignition of the auxiliary thyristors 2. Thus, by ignition of the auxiliary thyristors 2, the main power thyristors 1 will, in turn, become ignited.

I claim:

1. An arrangement for igniting each of a plurality of series connected power thyristors comprising a plurality of auxiliary thyristors arranged in series and connected between the anode side of each said power thyristor and its control electrode, and light-sensitive control elements individually connected to each said auxiliary thyristor and connected in a circuit with the control electrode thereof, and illumination means impinging upon said light-sensitive control elements for effecting simultaneous ignition of said auxiliary thyristors and hence simultaneous ignition of said power thyristors.

2. An arrangement as defined in claim 1 for igniting series connected power thyristors wherein said light-sensitive control elements are constituted by light-sensitive diodes, each said light-sensitive diode being connected in series opposition with a diode insensitive to light thus to form a diode pair which is arranged in series with other diode pairs across the anode, cathode and control electrodes of said auxiliary thyristors.

3. An arrangement as defined in claim 1 for igniting series connecting power thyristors wherein said light-sensitive control elements are phototransistors, each said phototransistor having its collector-emitter circuit connected in series with a resistor between the anode and cathode sides of the associated auxiliary thyristor, a first diode having its anode side connected to the collector which is also connected to the cathode of the associated auxiliary thyristor and its cathode side connected to the emitter, and a second diode having its anode side connected to the emitter and its cathode side connected to the control electrode of the associated auxiliary thyristor.

4. An arrangement as defined in claim 1 for igniting series connected power thyristors wherein said light-sensitive control elements are phototransistors, each said phototransistor having its collector connected to the control electrode of the associated auxiliary thyristor and its emitter connected to the junction between a resistor and a Zener diode arranged in a series circuit between the cathode and anode sides of the auxiliary thyristor.

5. An arrangement as defined in claim 1 for igniting series connected power thyristors wherein said light-sensitive control elements are phototransistors having their emitter-collector circuits connected between the anode side and control electrode of the associated auxiliary thyristor.

6. An arrangement as defined in claim 1 for igniting series connected power thyristors wherein said light-sensitive control elements are photoresistors connected between the anode side and control electrode of the associated auxiliary thyristor.